United States Patent [19]

Shoji

[11] Patent Number: 4,572,972
[45] Date of Patent: Feb. 25, 1986

[54] CMOS LOGIC CIRCUITS WITH ALL PULL-UP TRANSISTORS INTEGRATED IN SEPARATE CHIP FROM ALL PULL-DOWN TRANSISTORS

[75] Inventor: Masakazu Shoji, Warren, N.J.

[73] Assignee: AT&T Laboratories, Murray Hill, N.J.

[21] Appl. No.: 458,770

[22] Filed: Jan. 18, 1983

[51] Int. Cl.[4] .................................. H03K 17/687
[52] U.S. Cl. ........................... 307/303; 307/200 B; 307/453; 307/577; 307/584
[58] Field of Search ............. 307/200 A, 200 B, 303, 307/304, 443, 446, 448, 453, 480, 481, 572, 577, 581, 584, 585; 357/41

[56] References Cited

U.S. PATENT DOCUMENTS

| | | |
|---|---|---|
| 3,754,170 | 8/1973 | Tsuda et al. ................ 357/84 X |
| 3,832,575 | 8/1974 | Dasgupta et al. ............ 307/443 |
| 3,974,404 | 8/1976 | Davis ........................... 307/443 X |
| 4,002,928 | 1/1977 | Goser et al. ................. 307/303 X |
| 4,045,684 | 8/1977 | Eads et al. ................... 307/443 X |
| 4,198,648 | 4/1980 | Nishizawa ................... 307/446 X |
| 4,223,277 | 9/1980 | Taylor et al. ................ 330/264 |

Primary Examiner—John S. Heyman
Assistant Examiner—D. R. Hudspeth
Attorney, Agent, or Firm—David I. Caplan

[57] ABSTRACT

An integrated circuit chip with a preferred ground structure and including only pull-down transistors (on-chip) is operated by means of an off-chip pull-up transistor arrangement for precharging the data bus to logic high. The arrangement exhibits relatively low noise characteristics allowing relatively high frequency operation without generating noise voltages which exceed FET threshold voltages.

2 Claims, 8 Drawing Figures

CMOS LOGIC CIRCUITS WITH ALL PULL-UP TRANSISTORS INTEGRATED IN SEPARATE CHIP FROM ALL PULL-DOWN TRANSISTORS

FIELD OF THE INVENTION

This invention relates to integrated circuit (IC) microcomputer and microprocessor chips, and more particularly, to BUS structures and the like for such chips.

BACKGROUND OF THE INVENTION

Presently available microprocessor chips are wire-bonded into chip carriers. The pins of a chip carrier are wire bonded to bonding pads on the chip. The microprocessor circuits are also connected electrically to those pads. The wires which connect the pads to the pins contibute an indctance typically of 2-4 nano Henries (nH). Some of those wires are connected to the ground BUS in the microprocessor chip. When the output drivers of the microprocessor are operated to switch current which has accumulated on the ground and power BUSES, the associated inductance of the ground and power lead connection leads to a voltage difference between the chip carrier ground and power terminals on the one hand and the chip's internal ground on the other. The voltage difference is identified as ground and power BUS noise. This voltage appears in series with the voltage of the output drivers thereby confusing the logic levels represented by the output voltages.

Efforts to eliminate this ground and power BUS noise have not been particularly successful. In one particular effort, a central processor unit (CPU) was isolated from the external memory BUS by a separate interface chip. Moreover, the BUS was heavily loaded by a capacitance of about 450 picofarads. The interface chip required extra time for operation and considerably reduced operating speed (throughput). In order to obtain high throughput levels, the CPU must drive significant amounts of memory and interface chips directly.

In the future, this problem will become even more complicated. Sharing of chip input-output (I/O) ports with associated multiplexing will have to be curtailed and increased numbers of BUSES will have to be driven simultaneously. Moreover, each external BUS will have about 100-150 picofarads (pF) capacitance load. Under such demands, the only way to reduce noise appears to be to provide a large number of ground connections.

But a problem exists with respect to the number of ground connections ($N_G$) which can be permitted while still keeping the power BUS noise below the MOS threshold voltage ($V_{TH}$) of 0.5 V. In this connection, the following equation (1) must be satisfied in order to keep the ground of power BUS noise less than $V_{TH}$:

$$N_G \geq \frac{V_{DD}}{V_{TH}} \frac{4L_S C}{T^2} N_T \quad (1)$$

where
$N_T$=total number of drivers switching simultaneously.
$N_G$=total number of ground connections.
$L_S$=inductance per bonding wire (4NH).
$V_{DD}$=power supply voltage (5 V).
$V_{TH}$=MOS threshold voltage (0.5 V).
C=capacitance of a single data bus wire (150 pF).
T=time required for an output driver to switch.

The equation provides the absolute minimum number of ground connections required for an ideal triangular discharge current waveform. As a practical matter, the number must be larger by at least a factor of two. Specifically, the formula does not provide for internally generated current spikes or for process variation. An additional factor of at least two, and realistically four, is required to compensate for such spikes and variations. If the right side of equation (1) is multiplied by a factor of four, equation (1) reduces to:

$$N_G \geq \frac{96 N_T}{T^2_{(NS)}} \quad (2)$$

where T is in nanoseconds (NS). If we assume T is a ½ machine cycle at 25 MHz and 100 drivers switched simultaneously, then $$N_G \geq 24. \quad (3)$$

If this many ground connections are not provided, the chip generates a noise voltage higher than the MOS threshold. As system performance improves, the number of drivers which switch simultaneously also will have to increase as will BUS capacitance. The resulting requirement on the minimum number of ground connections is forbidding.

BRIEF DESCRIPTION OF THE INVENTION

The present invention calls for providing an IC chip structure including a wide area ground connection through the substrate of the chip to a large area conducting layer on the back surface of the chip. The system is organized so that all I/O (input-output) pull-up transistors are located off-chip. The pull-up transistors are precharged prior to I/O operations and discharged along the ground BUS by on-chip pull-down transistors. The chip need not supply pull-up power as is the case in prior art arrangements which use both pull-up and pull-down transistors located on-chip. The secure on-chip ground structure, as well as the organization in which I/O pull-up transistors are located off-chip, are considered significant departures from prior art thinking.

The preferred embodiment employs a chip which includes a P+ silicon substrate. An epitaxial layer is grown on the substrate and a CMOS IC is grown therein. The notation P+ indicates an impurity concentration in excess of $2 \times 10^{18}$ acceptors/cm$^3$. A P+ substrate permits a non-rectifying connection of the (metal) ground BUS structure to the substrate. The ground BUS is in the configuration of a frame about the edge of the chip, and since current flows vertically the path has a relatively low series inductance and since the contact area is large, it has a low resistance. The main contribution to the impedance is the series resistance of the diffusion contact.

The structure also enables a secure common ground to be supplied for all chips of a multichip module. The chips of such a module communicate with one another through a precharged Data BUS and the precharge can be carried out by PFET's or by PNP transistors. Current pulse flows through the power BUS only when the Data BUS is precharged, the precharge device being located adjacent to a $V_{DD}$-ground bypass capacitor, thereby avoiding $V_{DD}$ (power) BUS noise.

DETAILED DESCRIPTION

Figure 1:
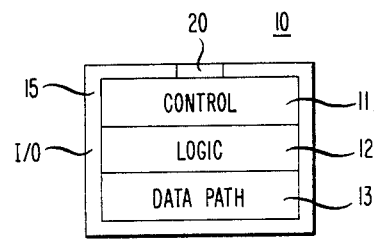
FIG. 1 is a schematic diagram of an integrated circuit (IC) chip in which a microprocessor is defined.

FIG. 1 shows an IC chip 10 including a microprocessor. The microprocessor comprises the familiar control, logic, and data path portions 11, 12 and 13, respectively. Encompassing the various portions is the familiar I/O circuitry represented by frame 15. A single bit portion 20 of frame 15 is shown in FIG. 2.

Figure 2:
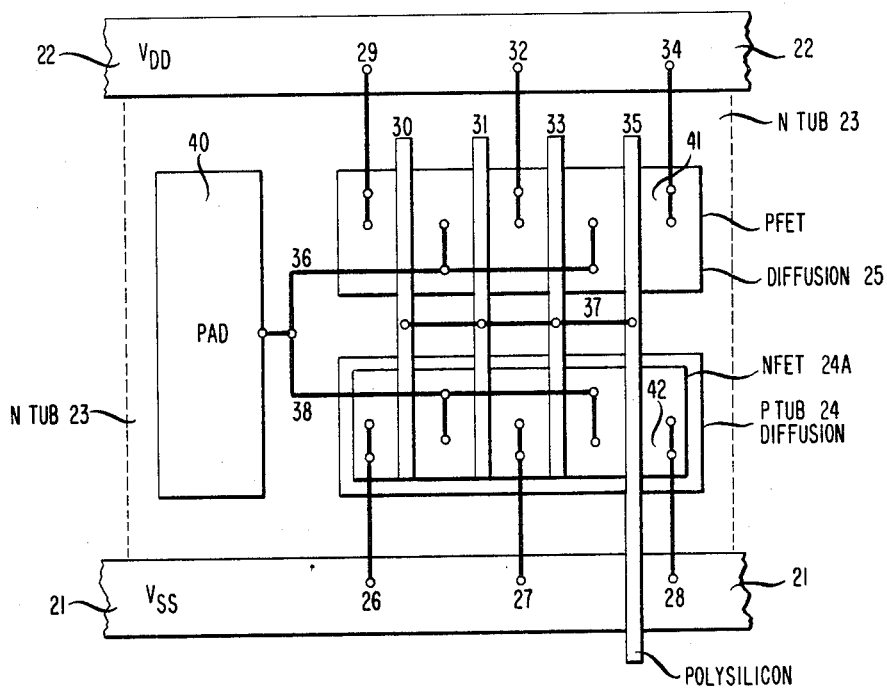
FIGS. 2 and 3 are schematic representations of portions of the chip of FIG. 1.
Figure 3:
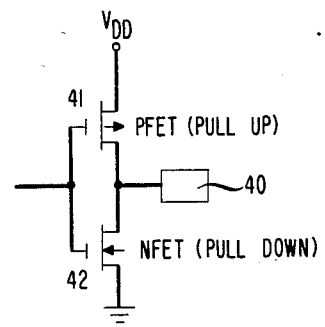

Portion 20 of a prior art arrangement includes spaced-apart ground and power BUSES 21 and 22 as shown in FIG. 2. An NTUB diffusion region 23 extends between the two BUSES and demarcates the area in which PFET transistors are defined and electrical connections are made. PTUB diffusion region 24 is defined within the NTUB region. In addition, a P diffusion region 25 is included in the NTUB region. An N diffusion region 24A is defined in PTUB 24 also. A plurality of electrically conducting lines are defined to interconnect the various diffusion regions and the BUSES. The vertical lines 26, 27, 28, 29, 32 and 34 are metal; the vertical lines 30, 31, 33 and 35 are polysilicon; and the horizontal lines 36, 37, and 38 are metal. P- and N-channel field effect transistors (FET's) are defined between associated metal and polysilicon lines to define familiar "pull-up" and "pull-down" transistor arrangements, represented by transistors 41 and 42 in FIG. 3. The horizontal metal lines are shown connected schematically to pad 40 in FIG. 2. In FIG. 3 the drains of transistors 41 and 42 are shown connected to pad 40. The sources of transistors 41 and 42 are connected to $V_{DD}$ and ground ($V_{SS}$), respectively. The gate electrodes of both transistors are connected to an internal signal source (not shown). It is clear that both the pull-up and pull-down transistors of the I/O frame 15 are located on-chip.

Figure 4:
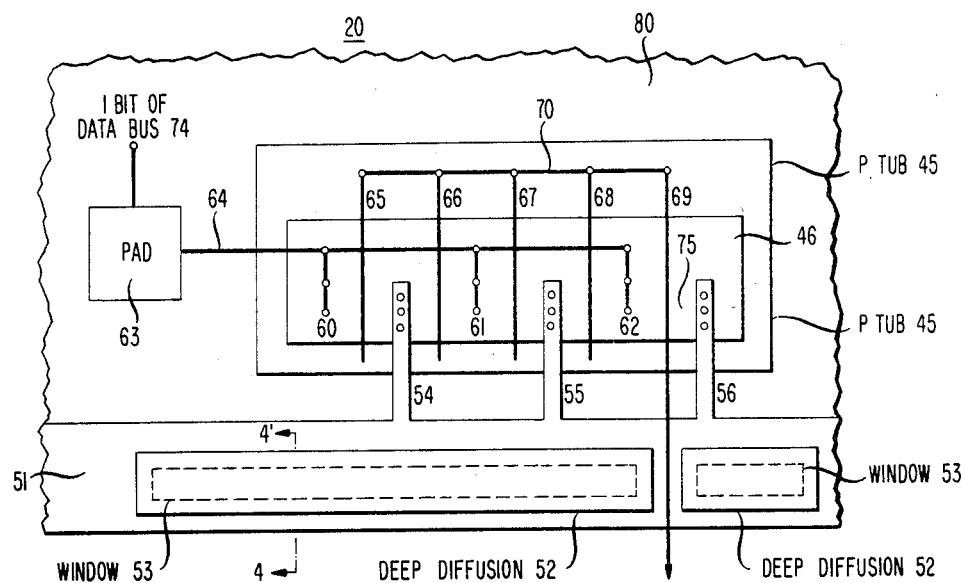
FIGS. 4 and 5 are schematic representations of portions of the chip of FIG. 1 rearranged in accordance with the teachings of this invention.

FIG. 4 shows a like portion of chip 10 with the I/O frame modified in accordance with the teachings of this invention. Specifically, portion 20 of FIG. 1 is configured in FIG. 4 so that it includes only pull-down transistors. A PTUB region 45 includes a smaller N diffusion region 46 in which the various NFET's are defined. No equivalent $V_{DD}$ (power) BUS exists in the arrangement of FIG. 4. Moreover, the $V_{SS}$ (ground) BUS 51 overlies a deep diffusion 52 and includes a window 53. The vertical (metal) lines 54, 55 and 56 interconnect the various NFET's to BUS 51. Vertical metal lines 60, 61 and 62 are connected to pad 63 via metal line 64. Vertical polysilicon lines 65, 66, 67, 68 and 69 are interconnected by metal line 70. Line 69 is connected to an internal signal source (not shown).

Figure 5:
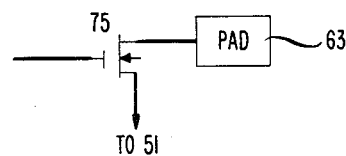

FIG. 5 shows the circuit schematic of an illustrative (NFET) pull-down transistor 75 in the arrangement of FIG. 4. The drain of the transistor is connected to pad 63 and the source is connected to ground BUS 51. The gate electrode is connected to an internal signal source (not shown). The module includes a chip 10 configured as shown in FIGS. 4 and 5 represented in FIG. 6. The pad is interconnected to the module power ($V_{DD}$) BUS 73 by (precharged) Data BUS 74 via (P-channel) pull-up transistors $75_1$–$75_N$, one for each bit on the BUS. $V_{DD}$ ground bypass capacitor 77 is located close to the pull-up transistors. It should be clear at this juncture that pull up transistors for chip 10 of FIG. 4 are located off the chip.

Figure 7:
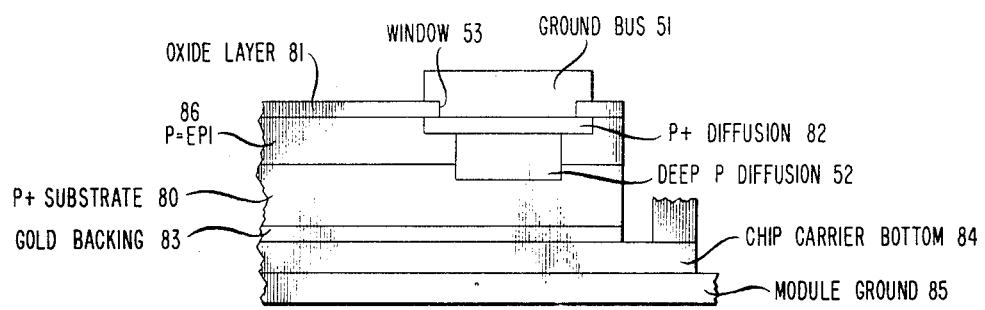
FIG. 7 is a cross section of the chip of FIG. 1 taken along line 4—4' as shown in FIG. 4.

It was noted that no equivalent of the power BUS $V_{DD}$ of FIG. 2 is shown in FIG. 4. Only the equivalent of the ground BUS is present. FIG. 7 shows a cross section taken along broken line 4—4' of FIG. 4 and illustrates the structure of the ground BUS in the arrangement of FIG. 4. Ground BUS 51 makes ohmic connection to P+ substrate 80, through window 53 in oxide layer 81, via a P+ diffusion 82 and a deep diffusion 52 which provide penetration through the P epitaxial layer 86. The substrate has a gold backing layer 83 for providing a secure ground connection via the chip carrier bottom 84 to the module ground 85. A solid and secure ground connection is assured.

Figure 6:
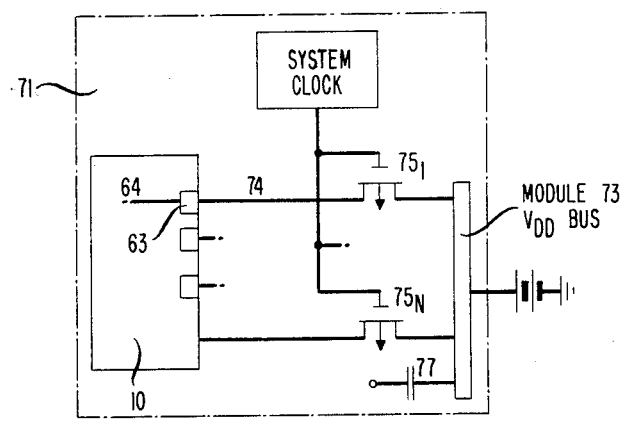
FIG. 6 is a schematic representation of a module including the chip of FIG. 1 modified in accordance with this invention as shown in FIGS. 4 and 5.
Figure 8:
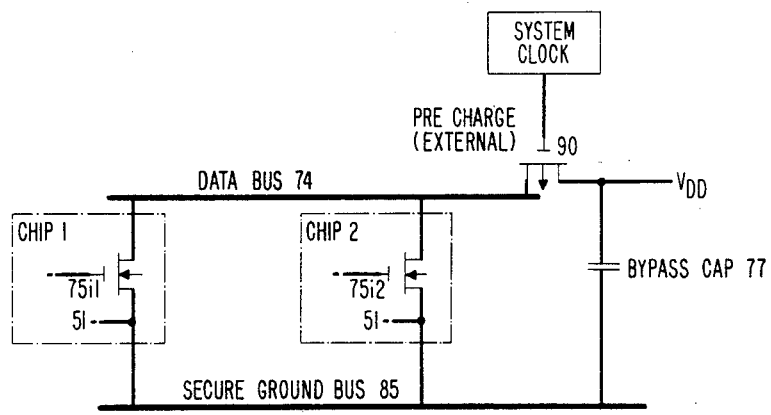
FIG. 8 is a schematic representation of a system module of the type shown in FIG. 6 but including several chips of the type shown in FIGS. 1, 4, and 5.

FIG. 8 illustrates the interconnection of a plurality of chips of FIG. 1 configured as shown in FIGS. 4 and 5 and connected to a module as shown in FIG. 6. The various elements of FIG. 8 are designated exactly as shown in FIGS. 4, 5 and 6. The Figures show a single off-chip pull-up transistor 90 interconnecting each of representative on-chip pull-down transistors $75i1$, $75i2$, ..., etc., for each of chips 1, 2, ..., etc., respectively. Each transistor is used as a component in a circuit which can be represented as shown in the prior art arrangement of FIG. 3. Power $V_{DD}$ is supplied via off-chip transistor 90 to the drain electrodes of each of pull-down transistors $75i1$, $75i2$, .... The source electrodes of the pull-down transistors are connected to module ground 85 and the gate electrodes are connected to the internal source of data of each chip. Bypass capacitor 77 of FIG. 6 is connected between (module) $V_{DD}$ and module ground BUS 85. It is to be noted again that no structure equivalent to the power BUS $V_{DD}$ of FIG. 2 is present in FIG. 4. Power is supplied through an off-chip pull-up arrangement cooperative with the secure ground arrangement of FIGS. 4 and 7 to achieve the organization of FIG. 8.

What is claimed is:

1. An IC chip having front and back surfaces, said chip including a first BUS on said front surface, said first BUS being connected through a conductive substrate region of said chip to a metallic layer which coats said back surface, a plurality of pull-down transistors being integrated in said chip and being connected for pulling the voltage levels of bit lines in an external BUS down to the voltage level of the first BUS in response to logic signals applied to the control terminals of the pull-down transistors.

2. An IC chip in accordance with claim 1 wherein said first BUS comprises a ground BUS and said external BUS comprises a Data BUS, and a second chip having integrated therein an equal plurality of pull-up transistors connectable to the external BUS, whereby each of the pull-up transistors together with a corresponding one of the pull-down transistor forms a CMOS inverter.

* * * * *